United States Patent [19]

Park

[11] Patent Number: 4,975,616

[45] Date of Patent: Dec. 4, 1990

[54] PIEZOELECTRIC TRANSDUCER ARRAY

[75] Inventor: Kyung T. Park, Berwyn, Pa.

[73] Assignee: Atochem North America, Inc., Philadelphia, Pa.

[21] Appl. No.: 233,627

[22] Filed: Aug. 18, 1988

[51] Int. Cl.⁵ .......................................... H01L 41/08
[52] U.S. Cl. ..................................... 310/339; 310/366; 310/800
[58] Field of Search ............... 310/328, 338, 339, 366, 310/800; 340/365 A

[56] References Cited

U.S. PATENT DOCUMENTS

| | | | |
|---|---|---|---|
| 3,648,279 | 3/1972 | Watson | 310/339 X |
| 3,940,637 | 2/1976 | Ohigashi et al. | 310/339 |
| 3,976,899 | 8/1976 | Fanshawe | 310/339 |
| 4,071,785 | 1/1978 | Yoshida et al. | 310/331 |
| 4,234,813 | 11/1980 | Iguchi et al. | 310/366 |
| 4,328,441 | 5/1982 | Kroeger, Jr. et al. | 310/339 X |
| 4,458,173 | 7/1984 | Kaufman et al. | 310/338 |
| 4,516,112 | 5/1985 | Chen | 340/365 R |
| 4,555,953 | 12/1985 | Dario et al. | 73/862.04 |
| 4,633,123 | 12/1986 | Radice | 310/339 |

FOREIGN PATENT DOCUMENTS

2445805 4/1976 Fed. Rep. of Germany ...... 310/339
1550691 8/1979 United Kingdom .

Primary Examiner—Mark O. Budd
Attorney, Agent, or Firm—Seidel, Gonda, Lavorgna & Monaco

[57] ABSTRACT

A piezoelectric transducer array comprises a plurality of piezoelectric transducer means arranged in an array. A common electrode is provided among at least a plurality of the piezoelectric transducer means. A plurality of discrete signal electrodes is operatively associated with each transducer means. The number of signal electrodes for each transducer means is the same. The surface areas of the signal electrodes for each transducer means are adapted and arranged for generating a signal unique to each transducer means. Corresponding ones of the signal electrodes of each plurality of signal electrodes are connected together with a common conductor to form a single electrical terminal. The total number of resulting electrical terminals is the same as the number of signal electrodes for each transducer means.

30 Claims, 5 Drawing Sheets

PIEZOELECTRIC TRANSDUCER ARRAY

FIELD OF THE INVENTION

The present invention is directed to a piezoelectric transducer array in general and, in particular, relates to an improved piezoelectric keyboard array.

BACKGROUND OF THE INVENTION

A key switch is capable of generating a voltage signal when a force is applied to the switch. The resultant voltage signal may be employed in applications involving computers, alphanumeric keyboards, kitchen appliances and numerous other electronic devices.

Conventional metal contact key switches become unreliable after extended periods of use. For example, contact resistance tends to increase with age, and poor contact with the contact points produces undesirable chatter and/or bounce. In an effort to overcome the general unreliability of metal contact key switches, Hall effect key switches employing magnetic resistance elements and capacitive key switches have been developed, but each requires elaborate or complicated parts and/or controlling circuits.

More recently, poled polymeric piezoelectric films to function as the force sensing element have been developed. These films substantially overcome the deficiencies of metal contact key switches, as well as the deficiencies inherent in piezoelectric ceramics which are hard, brittle, easily broken, difficult to machine into complex shapes and often generate spurious voltage signals from sound waves striking their surfaces.

A preferred poled polymeric piezoelectric film is polyvinylidene fluoride (PVDF). By carefully controlling process steps to polarize the PVDF film, including mechanical orientation and treatment in an intense electric field, a highly piezoelectric and pyroelectric film results. Such a film is commercially available under the trademark KYNAR ®, a product of Pennwalt Corporation, Philadelphia, Pennsylvania, assignee of the present invention.

Kynar ® PVDF film is flexible, tough and inexpensive, possesses a low modulus and a low mechanical Q factor, and hence little or no chattering. Many present day keyboards employ PVDF films as the piezoelectric or pyroelectric sensing element.

Kynar ® film produces an electric charge that is proportional to applied stress (or strain) or to thermal energy. This charge represents an output signal of the film. The intensity of the output signal varies with ambient temperature of the film, the area of electrode metallization on the film and its thickness, the piezoelectric/pyroelectric constants for the film, the rate at which the stress (or strain) or thermal energy is applied, mechanical conditions (film tautness, laminations, mechanical noise and mechanical interelement coupling) and circuit conditions (shielding, impedance and leakage).

Prior art keyboard designs using PVDF film suffer a number of drawbacks, such as an excessive number of individual wire leads from the switch locations, and susceptibility to mechanical coupling and electrical crosstalk. These drawbacks do not result from using PVDF film but from unimaginative design. In addition, prior art keyboards require complicated decoding circuitry to identify precisely which one of an array of switches is actuated. This adds to the cost and complexity of such keyboards.

It is an object of this invention to provide a keyboard that reduces lead count to as few as three leads on a complex, multi-switch keyboard, thereby minimizing circuitry while providing a "smart" output signal which specifically identifies the actuated key by developing an electrical signal unique to that key

SUMMARY OF THE INVENTION

The present invention is a piezoelectric transducer array comprising a plurality of piezoelectric transducer means arranged in an array. A common electrode for at least a plurality of said transducer means is provided. A plurality of discrete signal electrodes is operatively associated with each transducer means. The number of signal electrodes for each transducer means is the same. The surface areas of the signal electrodes for each transducer means is adapted and arranged for generating a signal unique to each transducer means. Signal electrodes of corresponding surface area of each plurality are connected together by a common conductor.

The signals resulting from actuation of a transducer location are unique to each transducer location.

DESCRIPTION OF THE DRAWINGS

For the purpose of illustrating the invention, there is shown in the drawings a form which is presently preferred; it being understood, however, that this invention is not limited to the precise arrangements and instrumentalities shown.

DESCRIPTION OF THE DRAWINGS

Figure 1A:
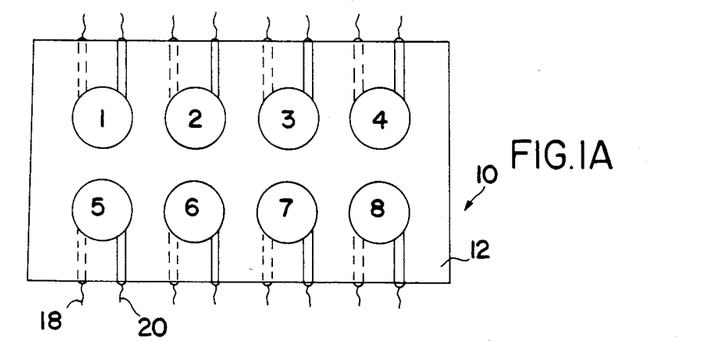
FIGS. 1A and 1B illustrate one form of prior art keyboard array.
Figure 1B:
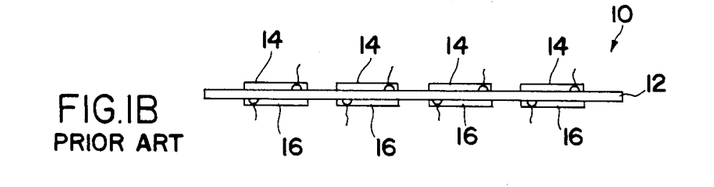

Referring now to the drawings, there is shown in FIGS. 1A and 1B one type of prior art keyboard using piezoelectric polymer film. The keyboard is designated generally by the numeral 10 and comprises a sheet 12 of piezoelectric polymer film on which are contained a number of individual key locations, numbered 1 through 8 for illustration. As best seen in FIG. 1B, each individual key location has its own "hot" electrode 14 and ground electrode 16. Each pair of electrodes 14, 16 and the portion of the piezoelectric polymer film between the electrodes comprises an individual transducer location. When a transducer location is activated by pressure, for example, an electrical signal is generated.

A major disadvantage with this type of prior art system is that the patterning and alignment of the electrodes is critical. Moreover, each key must have two dedicated leads 18 and 20 (see FIG. 1A) so that the electrical signal generated by an individual key location can be coupled to processing and decoding circuitry. For a complex keyboard such as a typewriter keyboard or a computer keyboard, the number of individual leads 18, 20 obviously becomes quite large, adding to the cost and complexity of the keyboard and decreasing its reliability. Further, with this type of keyboard each individual key location must be mechanically decoupled to avoid interkey stress (or strain) or pyroelectric crosstalk between keys, which could lead to erroneous results.

Figure 2A:
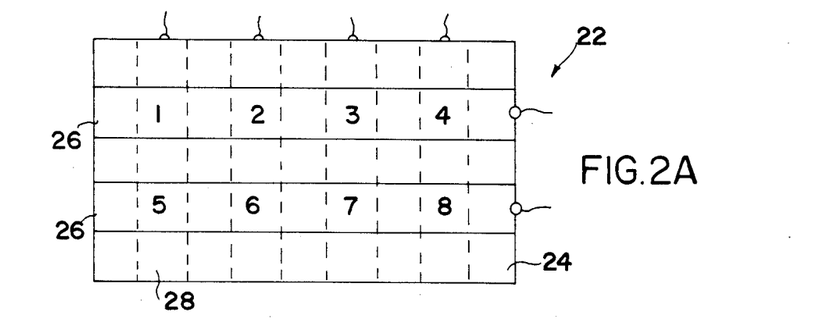
FIGS. 2A and 2B illustrate another form of prior art keyboard array.
Figure 2B:
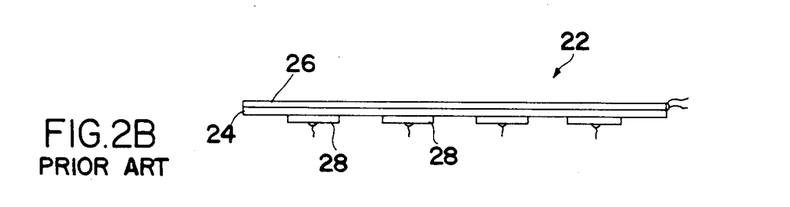

FIGS. 2A and 2B show another type of prior art piezoelectric polymer keyboard 22 designed to reduce the number of individual leads required. In this type of keyboard, a piezoelectric polymer film 24 is provided with orthogonal row electrodes 26 on one surface of film 24 and column electrodes 28 on the opposite surface. The orthogonal row and column electrodes 26, 28 form key sites where they intersect. The key sites are designated by the numerals 1 through 8 for illustration. This type of structure, using the intersection of row and column electrodes, reduces the lead count to the number of rows plus the number of columns.

As with the prior art keyboard of FIGS. 1A and 1B, mechanical decoupling is required to reduce cross-talk between key sites. However, the major drawback with this type of keyboard illustrated in FIGS. 2A and 2B is interelement capacitive cross-talk, where several keys share a common conductor and thereby charge developed at one key site by actuating a key causes a signal to be developed on adjacent keys which share the common conductor. Numerous attempts have been made to minimize this capacitive cross-talk, including using multiple piezoelectric film sheets (adding to cost), split-key electrode patterns to ground all keys individually, the use of spacers, where pressure squeezes two films together (a hybrid of piezoelectric and membrane technologies), and the like. None of these solutions is entirely satisfactory.

The present invention solves these problems and provides a keyboard that reduces lead count to as few as three leads on a complex keyboard, thereby minimizing cost and complexity and maximizing reliability, while providing a "smart" signal to processing electronics which specifically identifies the actuated key by an electrical signal unique to that key.

Figure 3:
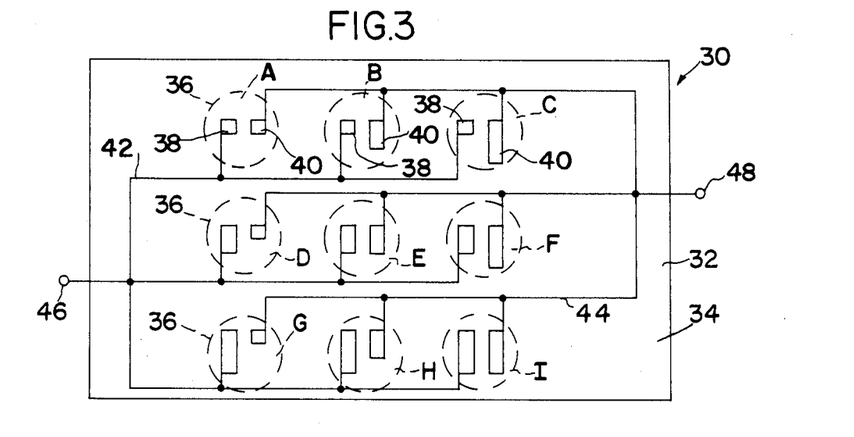
FIG. 3 illustrates in schematic form a keyboard array in accordance with one embodiment of the present invention.

Referring now to FIG. 3, a keyboard 30 in accordance with one embodiment of the invention is illustrated in schematic form. The keyboard 30 comprises a substrate in the form of a sheet 32 of piezoelectric polymer film which is preferably, but need not be, polyvinylidene fluoride film (PVDF). Although PVDF is preferred, any piezoelectric material such as piezoelectric ceramics or other piezoelectric polymer films can be utilized without departing from the scope of the invention. Copolymers of vinylidene fluoride and copolymerizable comonomers such as tetrafluoroethylene and trifluoroethylene, for example, may be employed.

A common electrode 34 is provided on one surface of PVDF film 32. Common electrode 34 is preferably in the form of a continuous metallized area and may cover substantially one entire surface of PVDF sheet 32. Common electrode 34 may be formed by any conventional metallization process, such as silkscreen printing, vacuum deposition, or the like. The opposite surface of PVDF film 32 is divided into a plurality of individual transducer locations, or key sites, 36. For purposes of illustration, 9 such key sites, designated A through I, are shown in FIG. 3. At each key site is a plurality of discrete electrodes. In the embodiment illustrated in FIG. 3, two discrete electrodes 38, 40 are illustrated, although the invention is not limited to the precise number of discrete electrodes used at each key site. Discrete electrodes 38, 40 are preferably, but not necessarily, formed of the same conductor material, and may also be formed in the same manner, as common electrode 34. Discrete electrodes 38, 40 are of the same thickness but not necessarily the same surface area. As can be seen in FIG. 3, the relative surface areas of electrodes 38, 40 are different and unique for each key site 36.

Corresponding electrodes for each of the plurality of electrodes at a key site are connected together with a common conductor to form a single electrical terminal for the corresponding electrodes. Thus, for example, corresponding electrodes 38 are connected together by common conductor 42 to form a single electrical terminal 46, while corresponding electrodes 40 are connected together by common conductor 44 to form a single electrical terminal 48.

In operation, because the electrodes 38 and 40 at each key site 36 have different surface areas, the electrical charge produced by actuation of a key site will be different and proportional to the surface areas of the electrodes at the actuated key site. The charges developed by a key site can be connected to conventional charge amplification circuitry at electrical terminals 46 and 48. Thus, the output signals for the entire keyboard are available using only two conductors 42 and 44 and two terminals 46 and 48, plus, of course, a terminal for common electrode 34 (not shown).

By way of example, electrodes 38 and 40 at key site A may be of equal area, and that area may be arbitrarily designated as equal to one. The charges generated by actuation of key site A, which will appear at terminals 46 and 48, will have an amplitude proportional to the surface areas of electrodes 38 and 40. That amplitude may also arbitrarily be assigned a value of one. Thus, whenever electrical charges having an amplitude of one are detected at terminals 46 and 48, that will indicate that key site A has been actuated. Key site C may be fabricated such that electrode 40 has three times the surface area of electrode 38, and electrode 38 at key site C may have an area equal to one. Thus, when key site C is actuated, the output signal at terminal 46 will have a value of one and the output signal at terminal 48 will have a value of three. When this condition is detected, it will indicate that key site C has been actuated. As long as the electrode pairs 38 and 40 have unique combinations of surface areas, any number of key sites, each of which will have a unique signal associated with it, can be fabricated, limited only by the accuracy achievable in forming unique electrode surface areas and the ability of the electronic charge-detecting circuitry to discriminate charge differences with good reliability.

Figure 4:
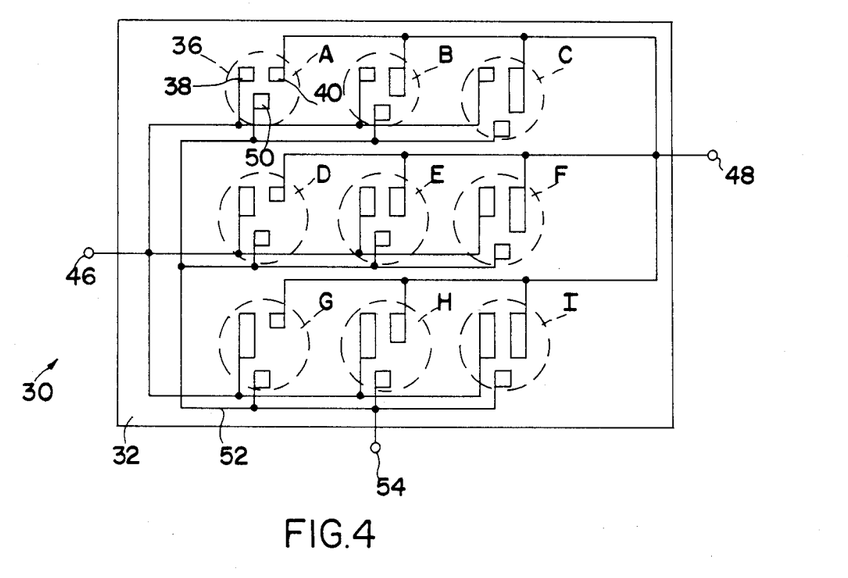
FIG. 4 illustrates in schematic form a keyboard array in accordance with a second embodiment of the present invention.

To enhance the reliability of accurately detecting which key site is actuated, a reference electrode of constant area can be added to each key site. Referring now to FIG. 4, a reference electrode 50 of constant area is provided at each individual key site 36 along with electrodes 38 and 40. Reference electrode 50 may be arbitrarily assigned an area equal to one. All of reference electrodes 50 are connected together by a common conductor 52 to create a reference terminal 54. Since reference electrodes 50 all have the same surface area, the output signal at terminal 54 will have the same amplitude regardless of which individual key site is actuated. As before, this amplitude can be arbitrarily assigned a value of one. With the addition of reference electrodes 50, the output signal at terminal 54 can be used as a reference for comparison of the signals at terminals 46 and 48. For example, a ratio detecting scheme can now be employed which makes keyboard 30 less dependent upon the actuation force with which an individual key site is activated. Since the output of PVDF film is proportional to the applied force, a greater force will produce a higher amplitude output, while a smaller force will produce a lower amplitude output. If a key site is actuated using only a small force, the actual output signal may be too low to reliably detect. However, if the ratio of output signals is obtained, detection accuracy is increased. By comparing the output signals to the reference signal, unique ratios for each individual key site can be obtained. This would not be possible with the embodiment shown in FIG. 3, since a ratio for key sites A, E and I, for example, would be identical because both electrodes have the same surface area at each of those sites, even though the surface areas differ from site to site.

With the embodiment shown in FIG. 4, the ratio of outputs for key sites A, E and I will always be unique when compared to the output signal from reference electrode 50. This is illustrated in tabular form in Table 1, below.

TABLE 1

| Key Site | Electrode Area 38 | 40 | 50 | Ratio of Charge 38/50 | 40/50 |
|---|---|---|---|---|---|
| A | 1 | 1 | 1 | 1 | 1 |
| B | 1 | 2 | 1 | 1 | 2 |
| C | 1 | 3 | 1 | 1 | 3 |
| D | 2 | 1 | 1 | 2 | 1 |
| E | 2 | 2 | 1 | 2 | 2 |
| F | 2 | 3 | 1 | 2 | 3 |
| G | 3 | 1 | 1 | 3 | 1 |
| H | 3 | 2 | 1 | 3 | 2 |
| I | 3 | 3 | 1 | 3 | 3 |

It can be seen from Table 1 that a unique, "smart" signal can be obtained by using a ratio detection scheme, and that the signal is independent of that actual force or pyroelectric input to a key site.

Figure 5:
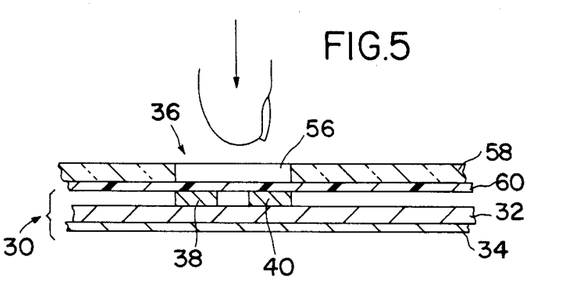
FIG. 5 illustrates in simplified form one way in which a keyboard array according to the present invention

FIG. 5 illustrates one manner in which a practical keyboard in accordance with the invention can be constructed. In FIG. 5, an individual key site 36 is defined by an opening 56 in a cover plate 58 which may, for example, be a thin sheet of plastic material. Below cover plate 58 is preferably a protective sheet 60 of clear material such as Mylar ®, below which is located keyboard 30. As seen in FIG. 5 electrodes 38 and 40 are aligned with opening 56. Pressure on Mylar ® sheet 60, for example finger pressure, provides the actuating force for key site 36.

Figure 6:
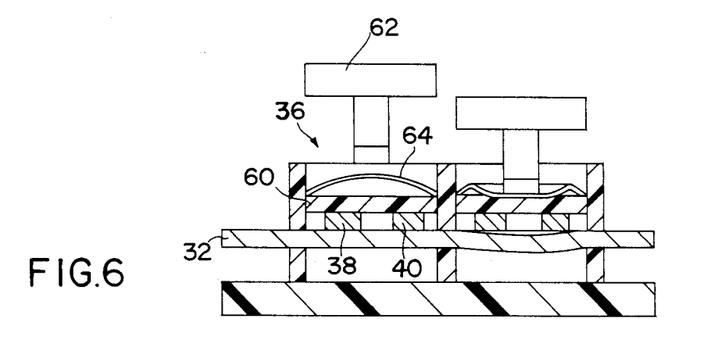
FIG. 6 illustrates in simplified form a second in which a keyboard array according to the present invention may be constructed.

FIG. 6 illustrates another way in which a practical keyboard can be constructed. In FIG. 6, individual key sites 36 include key actuating elements such as plunger 62, which is vertically reciprocable. Plunger 62 co-acts with snap disc 64 to provide an actuating force for key site 36. When plunger 62 is depressed, it causes snap disc 64 to snap over from the relaxed position shown in the left hand portion of FIG. 6, to the snapped position shown in the right hand portion of FIG. 6. This applies a uniform force to each key site.

Figure 7:
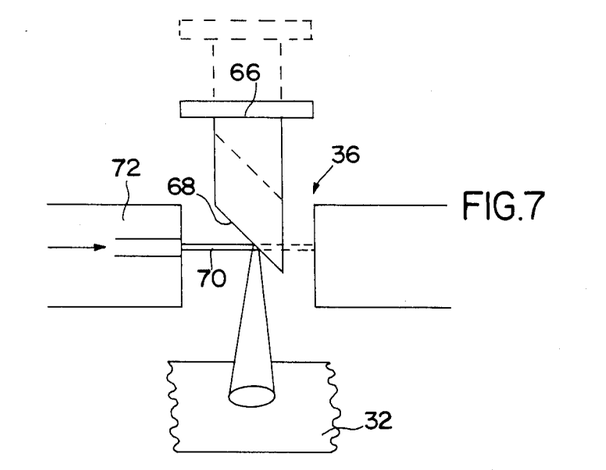
FIG. 7 illustrates in simplified form a third way in which a keyboard array according to the present invention may be constructed.

In addition to being sensitive to pressure, PVDF film is sensitive to thermal energy. Thus, as shown in FIG. 7, a keyboard actuated by thermal energy can be constructed. In FIG. 7, each key site 36 includes an actuator 66 which is vertically reciprocable. Plunger 66 has a reflective surface 68 which is disposed at an angle to the vertical. Infrared radiation 70 from an IR source 72 is directed horizontally with respect to FIG. 7. In the rest position, actuator 66 is in a position such that IR radiation 70 does not strike reflective surface 68, as indicated by the dashed lines in FIG. 7. When key site 36 is to be actuated, actuator 66 is pressed downwardly, and IR radiation 70 from IR source 72 is reflected by reflective surface 68 to the surface of PVDF film 32. The IR radiation reflected onto the surface of PVDF film 32 causes the film 32 to generate an output signal.

Figure 8:
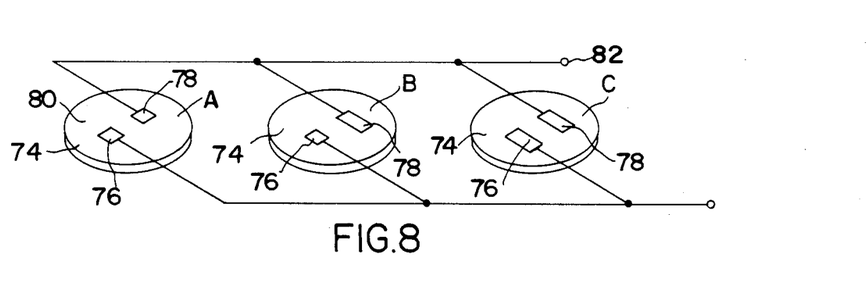
FIG. 8 illustrates in schematic form a keyboard array in accordance with a third embodiment of the present invention.

The present invention may be embodied in ways not limited to a single continuous substrate of piezoelectric film. For example, as shown in FIG. 8, the present invention can be embodied in an array of discreet transducers 74. For illustration purposes, three discreet transducers, labelled A, B and C, are shown in FIG. 8, although it is to be understood that any number of discreet transducers may be used to form an array. Likewise, although discreet transducers 74 are illustrated as circular discs, the precise geometric shape of the transducers is not critical. Discreet transducers 74 may utilize the preferred PVDF film as the transducer element, or may utilize any other piezoelectric material such as a piezoelectric ceramic. As with the previously-described embodiments, electrodes 76, 78 of different surface areas are provided on one surface of the transducers 74 at each key site A, B, and C. The opposite surface of each transducer 74 is provided with an electrode 80, as indicated by the partially dashed lead line in FIG. 8. Corresponding electrodes 76 of each transducer 74 are connected together to form a single electrical terminal 80, and corresponding electrodes 78 are connected together to form a single electrical terminal 82. Although omitted for clarity from the drawings, the electrodes on the opposite surfaces of transducers 74 are connected together to form a third, or common, electrode. A transducer array according to the embodiment of the invention shown in FIG. 8 operates in the same manner as the embodiments previously described, except that the transducer sites comprise discreet transducers instead of individual transducer locations on a common piezoelectric substrate.

Figure 9:
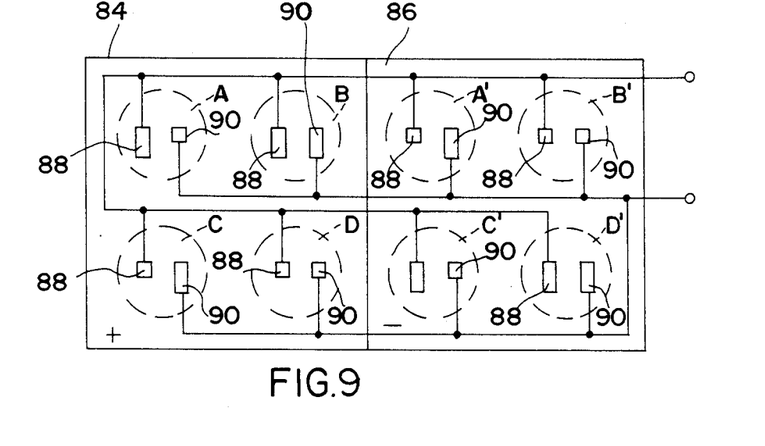
FIG. 9 illustrates in schematic form a keyboard array in accordance with a fourth embodiment of the present invention.

The number of individual transducer locations, or key sites, can be effectively doubled by utilizing the embodiment of the invention illustrated in FIG. 9. In FIG. 9, two substrates in the form of piezoelectric films 84 and 86, of opposite polarities, are shown. (Although for purposes of explanation films 84 and 86 will be referred to as two separate substrates, films 84 and 86 can be part of a single piezoelectric film with areas of opposite polarity. Areas of opposite polarity can be obtained on a single PVDF film by changing the poling voltage polarity in the film fabrication process, as will be understood by those skilled in the art. However, it is not critical to the present invention whether two separate sheets or a single sheet is used.) For purposes of illustration, each piezoelectric film 84, 86 has four individual key sites, A through D and A' through D', respectively, on one surface of the film. Although omitted for clarity from the drawings, the opposite surfaces of films 84, 86 is metallized to form a common electrode for the individual transducer sites. For purposes of illustration, film 84 is considered to have a positive polarity, indicated by the symbol "+", and film 86 is considered to have a negative polarity, as indicated by the symbol "−".

As shown in FIG. 9, key sites A through D on film 84 and A' through D' on film 86 have corresponding electrodes 88, 90 of different relative surface areas, as in the previously-described embodiments. Thus, on film 84, each key site A through D generates a unique output signal. The same is true for each key site A' through D' on film 86. However, in addition, because films 84 and 86 are of opposite polarity, different key sites on each film may have the same ratio of surface area of electrodes 88, 90 while still generating a unique signal. This, for example, when key site A is activated, it will generate an output signal which comprises a positive-going pulse followed by a negative-going pulse, indicating compression and release of key site A, as shown in the top waveform in FIG. 10. Since film 86 is of opposite polarity to film 84, activation of key site A', which may have the same ratio of surface area of electrodes 88, 90, will generate a signal of equal amplitude but opposite polarity, as shown by the bottom waveform in FIG. 10. Since film 86 is of opposite polarity to film 84, activation of key site A', which may have the same ratio of surface area of electrodes 88, 90 as key site A, will generate a signal of equal amplitude but opposite polarity, as shown by the bottom waveform in FIG. 10. Thus, by using two films of opposite polarity, the effective number of key sites can be doubled. Not only will each key site on film 84 generate a unique signal, it can be distinguished from a key site of identical electrode area on film 86 because of its opposite polarity.

Figure 10:
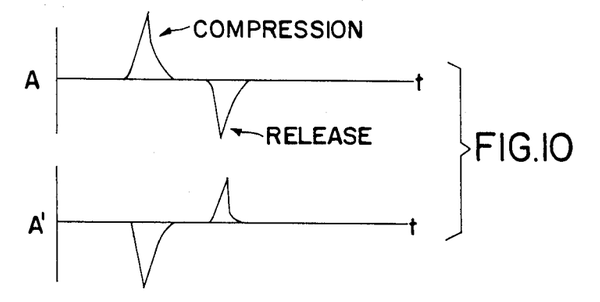
FIG. 10 illustrates typical electrical signals from a keyboard according to the embodiment shown in FIG. 9.

With further reference to the waveforms of FIG. 10, so-called static detection, such as "shift key" operation, can be performed by utilizing the polarity of the output signal. For example, the first output pulse of either waveform, indicating compression of a key site, can be utilized to activate a shift key function, where actuation of a given key site can perform two different functions depending on whether or not the shift key is depressed. As long as the shift key is compressed, shift key operation is possible. When the shift key is released, the second pulse indicating release of the key site is sensed, and shift key operation is terminated. Shift key operation is possible with all of the embodiments described herein.

Figure 11:
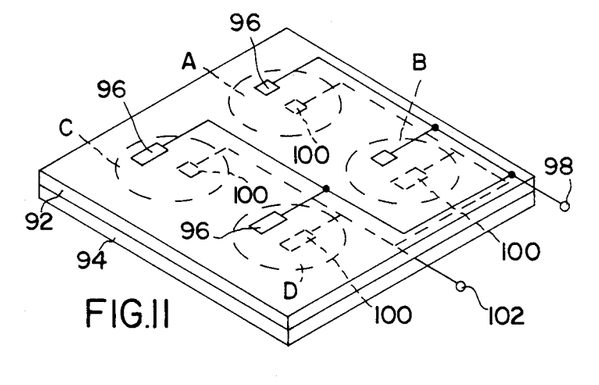
FIGS. 11 and 12 illustrate in schematic form a keyboard array in accordance with a fifth embodiment of the present invention.
Figure 12:
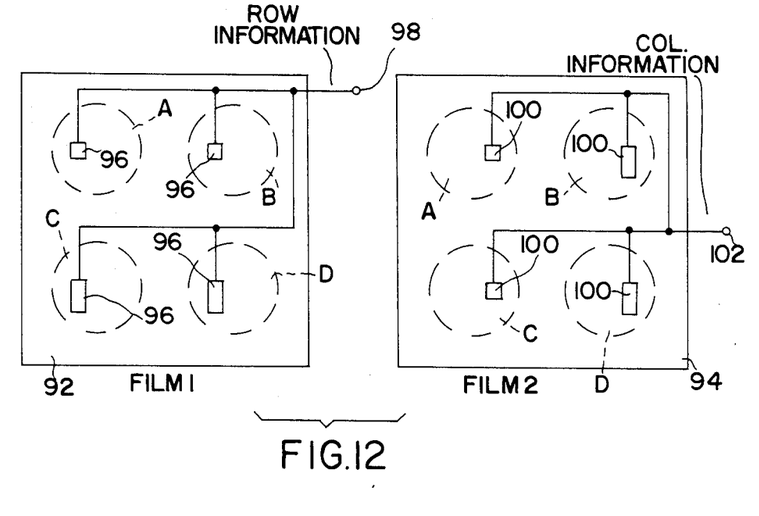

Referring now to FIGS. 11 and 12, there is shown still another embodiment of the invention using multiple layers 92, 94 of piezoelectric film. As shown in FIG. 11, one layer, such as layer 92, is superimposed on the other layer, such as layer 94. A plurality of key sites A through D is arranged on the upper surface of film 92, and a first corresponding electrode 96 is formed at each key site. Corresponding electrodes 96 are electrically connected together to form a single electrical terminal 98.

As best seen in FIG. 12, on the surface of layer 94, and in registry with layer 92, are four key sites also labelled A through D. Second corresponding electrodes 100 are formed at each key site A through D on layer 94, and are electrically connected together to form a single terminal 102.

Although omitted for clarity from the figures, the opposite surfaces of films 92 and 94 are metallized to form a common electrode for all of the key sites on each layer. An insulating layer (not shown) is provided between layers.

With the embodiment shown in FIGS. 11 and 12, when a key site is activated, a signal unique to the activated key site is obtained from terminals 98, 102, as with the previous embodiments. However, with this embodiment, it is easier to generate the unique signals in a way to provide row and column information so that, for a rectangular array, x-y information, or row and column information, can be obtained. As shown in FIG. 12, the corresponding electrodes 96 in the first row can be made to have the same surface area. Corresponding electrodes 96 in the second row can be made to also have the same surface area, but a surface area different from the surface area of common electrodes in the first row, and so forth for as many rows as may be desired. On film 92, common electrodes 100 in the first column can be made to have the same surface area, and common electrodes 100 in the second column can be made to also have the same surface area but a different surface area from common electrodes 100 in the first column, and so forth. In that way, in addition to generating a signal unique to a key site, the signal will contain information in the signal amplitude regarding the x-y position of the key site activated within the matrix.

Although the present invention has been described in terms of a keyboard array, the invention is not so limited, and other applications of the invention will suggest themselves to those skilled in the art. For example, the invention can also be used as a planar impact sensor, wherein the x-y coordinates of the point of impact of an object on a planar surface can be measured. In addition to x-y position, impact force can also be measured, since the transducers of the invention can be made sensitive to amplitude of an impact force.

The present invention may be embodied in other specific forms without departing from the spirit or essential attributes thereof and, accordingly, reference should be made to the appended claims, rather than to the foregoing specifications, as indicating the scope of the invention.

I claim:

1. A piezoelectric transducer array, comprising:
    a. a plurality of piezoelectric transducer means arranged in a generally planar array;
    b. a common electrode among at least a plurality of the piezoelectric transducer means;
    c. a plurality of discrete signal electrodes operatively associated with each transducer means on a surface of the plane of the array, the number of signal electrodes for each transducer means being the same, the relative sides of the surface areas of the signal electrodes for each transducer means being adapted and arranged to generate a plurality of charge output signals with a unique combination of magnitudes for generating a signal unique to each transducer means; and
    d. corresponding signal electrodes of each plurality being connected together by a common conductor.

2. A piezoelectric transducer array according to claim 1, wherein the transducer means comprise discrete piezoelectric transducers.

3. A piezoelectric transducer array according to claim 1, wherein the transducer means comprise a substrate of piezoelectric material having individual transducer locations on the substrate.

4. A piezoelectric transducer array according to claim 3, wherein the piezoelectric material is a piezoelectric polymer.

5. A piezoelectric transducer array according to claim 4, wherein the piezoelectric polymer is polyvinylidene fluoride.

6. A piezoelectric transducer array according to claim 1, further comprising one of the signal electrodes for at least two transducer means having the same surface area.

7. A piezoelectric transducer array according to claim 1, further comprising circuit means connected to the common conductor for utilizing the signals from actuated transducer means.

8. A piezoelectric transducer array, comprising:
   a. a sheet of piezoelectric material,
   b. individual transducer locations arranged in an array on the sheet,
   c. a common electrode on one surface of the sheet for at least a plurality of said transducer locations,
   d. a plurality of discrete electrodes on the opposite surface of the sheet at each transducer location, the number of electrodes at each transducer location being the same, the relative sizes of the surface areas of the electrodes at each transducer location being adapted and arranged to generate a plurality of charge output signals having a unique combination of magnitudes for generating a signal unique to each transducer location, and
   e. corresponding electrodes of each plurality being connected together by a common conductor to form at least two terminals.

9. A piezoelectric transducer array according to claim 8, further comprising one of the discrete electrodes for at least two transducer locations having the same surface area.

10. A piezoelectric transducer array according to claim 8, further comprising circuit means connected to the terminals for utilizing the signals from actuated transducer locations.

11. A piezoelectric transducer array according to claim 8, wherein the piezoelectric material is a piezoelectric polymer.

12. A piezoelectric transducer array according to claim 11, wherein the piezoelectric polymer is polyvinylidene fluoride.

13. A piezoelectric transducer array according to claim 8, wherein the polarity of the piezoelectric material at at least one transducer location is opposite to the polarity of the piezoelectric material at at least one other transducer location.

14. A keyboard comprising:
   a. a sheet of piezoelectric polymer film,
   b. a plurality of individual key sites arranged in an array on the film,
   c. a common electrode on one surface of the film for all key sites,
   d. a plurality of discrete electrodes on the opposite surface of the film at each key site, the number of discrete electrodes at each key site being the same, the electrodes at each key site having a unique combination of sizes of surface areas to generate a plurality of charge signals having a unique combination of magnitudes for generating an electrical signal unique to each key site upon actuation of the key site, and
   e. corresponding electrodes of each plurality being connected together by a common conductor.

15. A keyboard according to claim 14, wherein the plurality of discrete electrodes is equal to at least two.

16. A keyboard according to claim 14, further comprising one of the discrete electrodes for at least two key sites having the same surface area.

17. A keyboard according to claim 14, wherein the plurality of discrete electrodes is equal to at least three, one of the discrete electrodes at each key site having the same surface area.

18. A piezoelectric transducer array, comprising:
   a. a sheet of piezoelectric polymer film,
   b. individual transducer locations arranged in an array on the film,
   c. a common electrode on one surface of the film for all transducer locations,
   d. a plurality of discrete electrodes on the opposite surface of the film at each transducer location, the number of electrodes at each transducer location being the same, the relative sizes of the surface areas of the electrodes at each transducer location being adapted and arranged to generate a plurality of charge output signals with a unique combination of magnitudes for generating a signal unique to each transducer location, and
   e. corresponding ones of the electrodes of each plurality being connected together by a common conductor to form a single terminal, the total number of resulting terminals being the same as the number of electrodes at each transducer location.

19. A piezoelectric transducer array according to claim 18, wherein the piezoelectric polymer film comprises polyvinylidene fluoride.

20. A piezoelectric transducer array according to claim 18, wherein the polarity of the piezoelectric polymer film at at least one transducer location is opposite to the polarity of the piezoelectric polymer film at at least one other transducer location.

21. A piezoelectric transducer array, comprising:
   a. a first sheet of piezoelectric material having individual transducer locations arranged in an array on a first surface of the sheet and a common electrode for all transducer location on the opposite surface of the sheet,
   b. a second sheet of piezoelectric material having individual transducer locations arranged in an array on a first surface of the sheet and a common electrode for all transducer location on the opposite surface of the sheet, the individual transducer locations on the first and second sheets being in registry when the first sheet is superposed on the second sheet,
   c. an insulating layer between the first and second sheets,
   d. a plurality of discrete electrodes on the first surfaces of each sheet at each transducer location, the number of electrodes at each transducer location on each sheet being the same, the electrodes at each transducer location having a unique combination of sizes of surface areas to generate a plurality of charge output signals with a unique combination of magnitudes for generating a unique electrical signal representative of the location of a transducer location within the array upon actuation of the transducer, and
   e. the electrodes on each sheet being connected together by a common conductor.

22. A piezoelectric transducer array according to claim 21, wherein the transducer locations are arranged to form an orthogonal matrix of rows and columns.

23. A piezoelectric transducer array according to claim 22, wherein the discrete electrodes on one of said first and second sheets are adapted to generate signals representative of the row in which a transducer location is located upon actuation of the transducer location and the discrete electrodes on the other of said first and second sheets are adapted to generate signals representative of the column in which the transducer location is located.

24. A keyboard comprising:
   a. a sheet of pyroelectric material sensitive to thermal energy,
   b. a plurality of individual key sites arranged in an array on the sheet,
   c. a source of thermal energy disposed in proximity to the sheet,
   d. a plurality of actuators for selectively directing thermal energy from the source of thermal energy to a corresponding key site on the sheet,
   e. a common electrode on one surface of the sheet for all key sites,
   f. a plurality of discrete electrodes on the opposite surface of the sheet at the key site, the number of discrete electrodes at each key site being the same, the electrodes at each key site having a unique combination of sizes of surface areas for generating a plurality of unique combinations of charge magnitudes for generating an electrical signal unique to each key site upon exposure of the key site to thermal energy directed to a key site by one of the actuators, and
   g. corresponding electrodes of corresponding surface area of each plurality being connected together by a common conductor.

25. A keyboard as in claim 24, wherein each actuator includes a selectably reciprocable member having means thereon for directing thermal energy from the surface of thermal energy to the key site associated with the actuator.

26. A keyboard according to claim 24, wherein the plurality of discrete electrodes is equal to at least two.

27. A keyboard according to claim 24, further comprising one of the discrete electrodes for at least two key sites having the same surface area.

28. A keyboard according to claim 24, wherein the plurality of discrete electrodes is equal to at least three, one of the discrete electrodes at each key site having the same surface area.

29. A keyboard as in claim 24, wherein the source of thermal energy is a source of infrared radiation, and the pyroelectric material is polyvinylidene fluoride.

30. A piezoelectric transducer array as in claim 1, wherein the electrodes produce a charge of a magnitude substantially proportional to the mechanical force exerted thereon.

* * * * *